(12) United States Patent
Xu et al.

(10) Patent No.: US 11,494,011 B2
(45) Date of Patent: Nov. 8, 2022

(54) ELECTRONIC DEVICE

(71) Applicant: TPK Advanced Solutions Inc., Fujian (CN)

(72) Inventors: Xian Bin Xu, Xiamen (CN); Ming Qiang Fu, Liancheng County (CN); Shi Yuan Lian, Fu'an (CN); Yong Hui Huang, Longhai (CN); Xiong Min Zhang, Zhangpu County (CN); Chen Hsin Chang, Taoyuan (TW)

(73) Assignee: TPK Advanced Solutions Inc., Fujian (CN)

( * ) Notice: Subject to any disclaimer, the term of this patent is extended or adjusted under 35 U.S.C. 154(b) by 14 days.

(21) Appl. No.: 17/149,225

(22) Filed: Jan. 14, 2021

(65) Prior Publication Data

US 2022/0221948 A1    Jul. 14, 2022

(51) Int. Cl.
  *G06F 3/041*   (2006.01)
  *H05K 1/02*    (2006.01)
  *B32B 7/12*    (2006.01)
  *B32B 27/28*   (2006.01)
  *B32B 27/36*   (2006.01)

(52) U.S. Cl.
  CPC .............. *G06F 3/041* (2013.01); *B32B 7/12* (2013.01); *B32B 27/281* (2013.01); *B32B 27/36* (2013.01); *H05K 1/028* (2013.01); *H05K 1/0274* (2013.01); *B32B 2250/05* (2013.01); *B32B 2307/412* (2013.01); *B32B 2307/42* (2013.01); *B32B 2307/732* (2013.01); *B32B 2457/208* (2013.01); *H05K 2201/10121* (2013.01)

(58) Field of Classification Search
  CPC ......... B32B 7/12; G06F 3/041; G06F 3/0412; H05K 1/0287; H05K 1/028
  See application file for complete search history.

(56) References Cited

U.S. PATENT DOCUMENTS

| | | | |
|---|---|---|---|
| 2014/0362305 A1* | 12/2014 | Yao | G06F 3/041 349/12 |
| 2021/0096668 A1* | 4/2021 | Kwon | B32B 27/286 |
| 2021/0223879 A1* | 7/2021 | Xu | G06F 3/04164 |

FOREIGN PATENT DOCUMENTS

CN         106444121 B      2/2017

* cited by examiner

*Primary Examiner* — Zachary M Davis
(74) *Attorney, Agent, or Firm* — Cooper Legal Group, LLC

(57) ABSTRACT

An electronic device includes a substrate, a polarizer, a flexible printed circuit board, a first transparent glue layer, a first colloid, and a second colloid. The substrate includes a first side and a second side. The first side is opposite to the second side. The polarizer is disposed on the first side of the substrate. The flexible printed circuit board is connected to the first side of the substrate with a conductive glue. A gap is formed between flexible circuit board and polarizer. The first transparent glue layer is disposed on the second side of substrate. The first colloid is configured to bond at least two of substrate, polarizer, or flexible printed circuit board. The second colloid is configured to bond at least two of the substrate, the flexible printed circuit board, or the first transparent glue layer. The first colloid is not in contact with the second colloid.

20 Claims, 11 Drawing Sheets

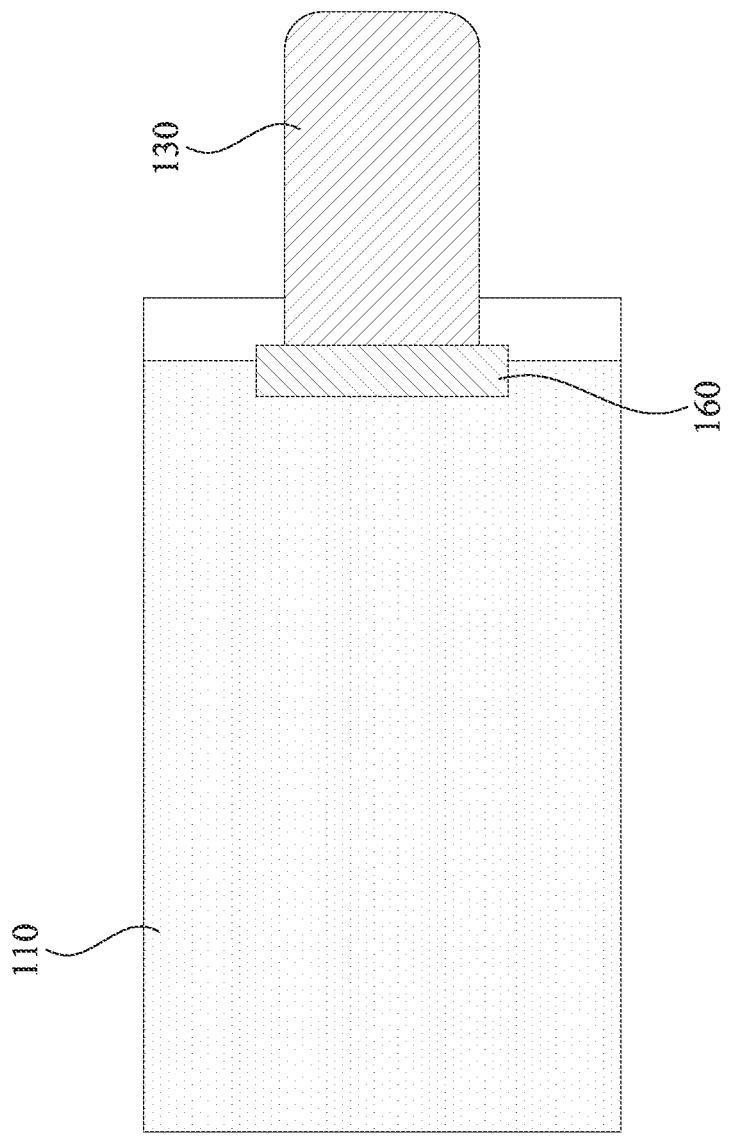

ELECTRONIC DEVICE

BACKGROUND

Field of Disclosure

The present disclosure relates to an electronic device. More particularly, the present disclosure relates to an electronic device in the field of the touch technology.

Description of Related Art

There is not enough support on upper and bottom sides of an edge of a bonding structure of conventional touch panels. During a process of assembling touch panels, a bending test needs to be performed on products so as to confirm the load of products under stress. Bonding structures of ultra-thin flexible substrates and flexible printed circuit boards are easily cracked after a period of use. As described in CN106444121B, the use of an adhesive layer on one side of substrate cannot meet the needs for bonding support of ultra-thin flexible substrate under stress.

For the foregoing reason, there is a need to provide some other suitable pin design method to solve the problems of the bonding method.

SUMMARY

One aspect of the present disclosure provides an electronic device. The electronic device includes a substrate, a polarizer, a flexible printed circuit board, a first transparent glue layer, a first colloid, and a second colloid. The substrate includes a first side and a second side. The first side is opposite to the second side. The polarizer is disposed on the first side of the substrate. The flexible printed circuit board is connected to the first side of the substrate with a conductive glue. A gap is formed between the flexible printed circuit board and the polarizer. The first transparent glue layer is disposed on the second side of the substrate. The first colloid is configured to bond at least two of the substrate, the polarizer, or the flexible printed circuit board. The second colloid is configured to bond at least two of the substrate, the flexible printed circuit board, or the first transparent glue layer. The first colloid is not in contact with the second colloid.

In the foregoing, a thickness of the first colloid located at the first side of the substrate is two times to five times bigger than a thickness of the substrate.

In the foregoing, a thickness of the substrate is smaller than or equal to 50 μm.

In the foregoing, the first colloid and the second colloid are a same material or different materials.

In the foregoing, each of the first colloid and the second colloid includes one of acrylic adhesive series or silica gel series.

In the foregoing, the electronic device further includes a second transparent glue layer. The second transparent glue layer is disposed on the polarizer and is partially overlapped or non-overlapped with the first colloid.

In the foregoing, a thickness of the second colloid is less than 100 μm.

In the foregoing, a width of the second colloid is less than 0.4 mm.

In the foregoing, the first colloid is configured to bond the polarizer and the flexible printed circuit board. The first colloid is partially overlapped with the second transparent glue layer. The second colloid is configured to bond the substrate, the flexible printed circuit board, and the first transparent glue layer.

In the foregoing, the first colloid is configured to bond the polarizer and the flexible printed circuit board. The first colloid is non-overlapped with the second transparent glue layer. The second colloid is configured to bond the substrate, the flexible printed circuit board, and the first transparent glue layer.

In the foregoing, the first colloid is configured to bond the polarizer and the flexible printed circuit board. The first colloid is partially overlapped with the second transparent glue layer. The second colloid is configured to bond the substrate and the flexible printed circuit board.

In the foregoing, the first colloid is configured to bond the polarizer and the flexible printed circuit board. The first colloid is partially overlapped with the second transparent glue layer. The second colloid is configured to bond the substrate and the first transparent glue layer.

In the foregoing, the first colloid is configured to bond the polarizer and the flexible printed circuit board. The first colloid is non-overlapped with the second transparent glue layer. The second colloid is configured to bond the substrate and the first transparent glue layer.

In the foregoing, the first colloid is configured to bond the polarizer and the flexible printed circuit board. The first colloid is non-overlapped with the second transparent glue layer. The second colloid is configured to bond the substrate and the flexible printed circuit board.

In summary, the present disclosure provides an electronic device to improve problems of cracks during a bending test.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows:

FIG. 6 depicts a bottom view of a part of a structure diagram of an electronic device according to some embodiments of the present disclosure.

DETAILED DESCRIPTION

Figure 1A:
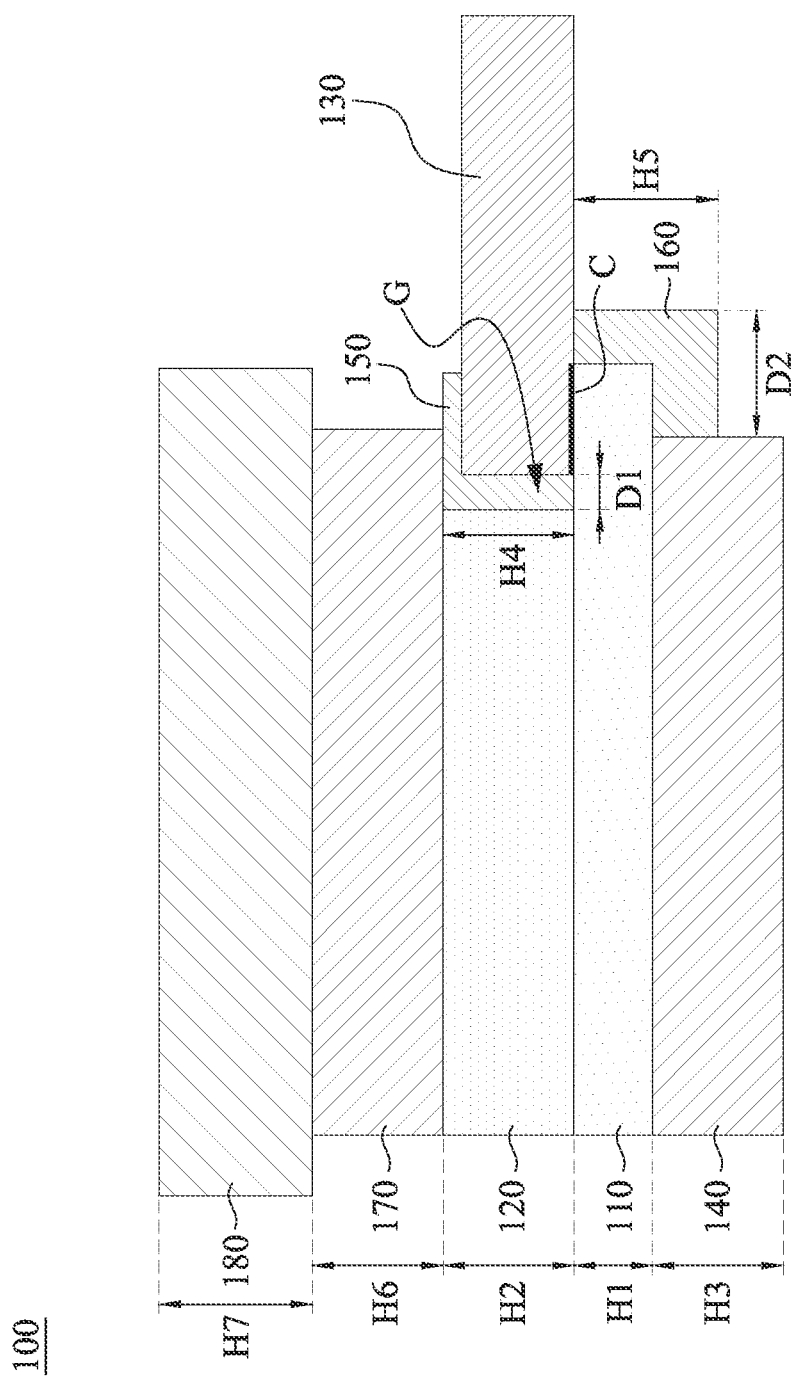
FIG. 1A depicts a part of a structure diagram of an electronic device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

FIG. 1A depicts a part of a structure diagram of an electronic device 100 according to some embodiments of the present disclosure. In some embodiments, referring to FIG. 1A, the electronic device 100 includes a substrate 110, a polarizer 120, a flexible printed circuit board 130, a first transparent glue layer 140, a first colloid 150, and a second colloid 160. In some embodiments, the electronic device 100 further includes a second transparent glue layer 170 and a cover 180.

In some embodiments, the substrate 110 includes a first side and a second side. The first side is an upper side of the substrate 110 shown in FIG. 1A. The second side is a lower side of the substrate 110 shown in FIG. 1A. The first side is opposite to the second side. It is noted that although the first side and the second side are depicted as an upper side and a lower side in FIG. 1A respectively, in practice, the first side and the second side are not limited to the upper side and the lower side. In some embodiments, the substrate 110 is a type of one glass solution (OGS) structure. It is noted that a touch panel of this type of one glass solution structure is easy to break when dropped or impacted. However, the substrate 110 of the present disclosure uses plastics such as Colorless Polyimide (CPI), Polyimide (PI), and/or polyethylene terephthalate (PET), such that the substrate 110 may slightly reduce the impact force when dropped or impacted and bear a certain range of bending.

In addition, the polarizer 120 is disposed on the first side of the substrate 110. The flexible printed circuit board 130 is connected to the first side of the substrate 110 with a conductive glue C. In some embodiments, a thickness H1 of the substrate 110 is smaller than or equal to 50 µm. In some embodiments, the conductive glue C is an anisotropic conductive adhesive.

In some embodiments, a gap G is formed between the flexible printed circuit board 130 and the polarizer 120. The first transparent glue layer 140 is disposed on the second side of the substrate 110. The first colloid 150 is configured to bond at least two of the substrate 110, the polarizer 120, or the flexible printed circuit board 130. The second colloid 160 is configured to bond at least two of the substrate 110, the flexible printed circuit board 130, or the first transparent glue layer 140. The first colloid 150 is not in contact with the second colloid 160. In some embodiments, a range of width D1 of the gap G is 0.5 mm to 1.5 mm. When the gap G is filled up with the first colloid 150, the thickness of the first colloid 150 is the same as a thickness of the gap G. In some embodiments, the shape and the size of each of the first colloid 150 and the second colloid 160 are not limited to the embodiment shown in the figure.

In some embodiments, a thickness H3 of the first transparent glue layer 140 is 100 µm. A thickness H6 of the second transparent glue layer 170 is 50 µm. A thickness H7 of the cover 180 is 60 µm. It is noted that the first transparent glue layer 140 and the second transparent glue layer 170 are elastic so as to absorb most external forces such that the influence of the external forces on the substrate 110 can be reduced.

In some embodiments, the aforementioned first colloid 150 and the aforementioned second colloid 160 are the same material or different materials. In some embodiments, materials of the aforementioned first colloid 150 and the aforementioned second colloid 160 include one of acrylic adhesive series or silica gel series. In some embodiments, the acrylic adhesive series can be one of model numbers such as Hysol-PC40-UMF, PERTEX-8106, or Henkel-3319M, but the disclosure is not limited to these model numbers. In some embodiments, the silica gel series can be one of model numbers such as WACKER-Lumi100 or momentive-OP2012L. It is noted that the first colloid 150 and the second colloid 160 of the present disclosure are a kind of curing glue so as to strengthen a bonding structure of the substrate 110 and the flexible printed circuit board 130 of the present disclosure and prevent the touch panel from cracking after the bonding structure is bent dozens of times.

In some embodiments, the first colloid 150 is configured to bond the polarizer 120 and the flexible printed circuit board 130. The first colloid 150 is partially overlapped with the second transparent glue layer 170. The second colloid 160 is configured to bond the substrate 110, the flexible printed circuit board 130, and the first transparent glue layer 140.

Figure 1B:
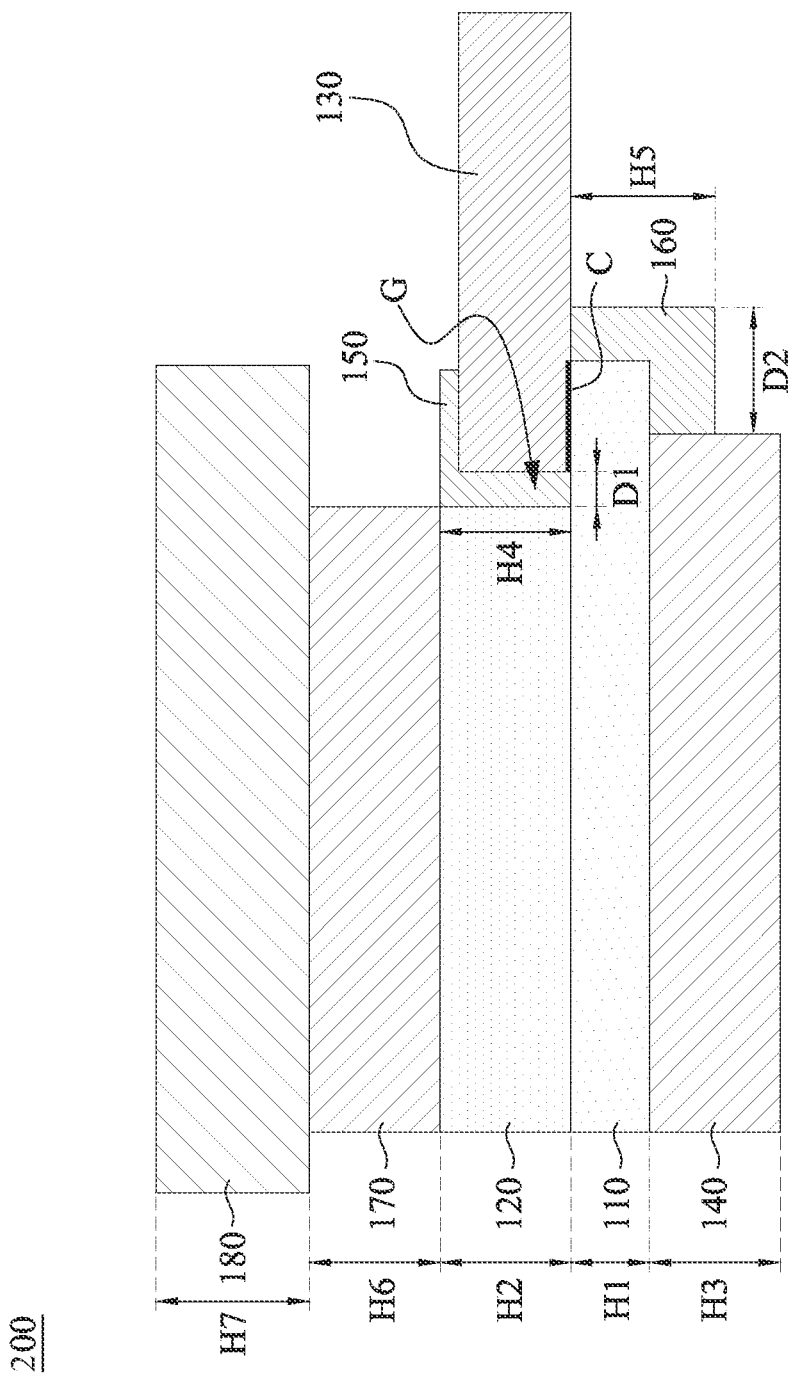
FIG. 1B depicts a part of a structure diagram of an electronic device according to some embodiments of the present disclosure.

FIG. 1B depicts a part of a structure diagram of an electronic device 200 according to some embodiments of the present disclosure. In some embodiments, the first colloid 150 is configured to bond the polarizer 120 and the flexible printed circuit board 130. The first colloid 150 is non-overlapped with (i.e., does not overlap with) the second transparent glue layer 170. The second colloid 160 is configured to bond the substrate 110, the flexible printed circuit board 130, and the first transparent glue layer 140.

Figure 1C:
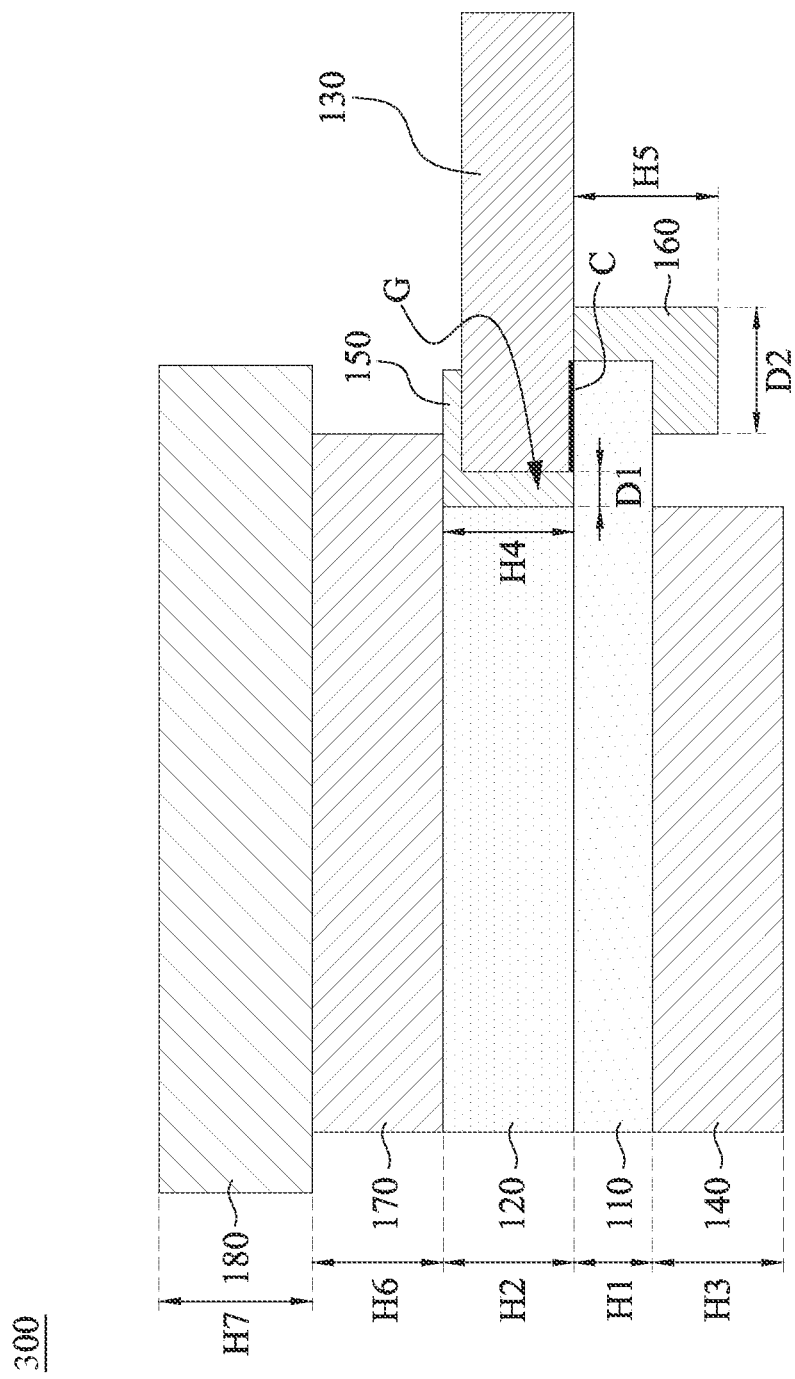
FIG. 1C depicts a part of a structure diagram of an electronic device according to some embodiments of the present disclosure.

FIG. 1C depicts a part of a structure diagram of an electronic device 300 according to some embodiments of the present disclosure. In some embodiments, the first colloid 150 is configured to bond the polarizer 120 and the flexible printed circuit board 130. The first colloid 150 is partially overlapped with the second transparent glue layer 170. The second colloid 160 is configured to bond the substrate 110 and the flexible printed circuit board 130.

Figure 1D:
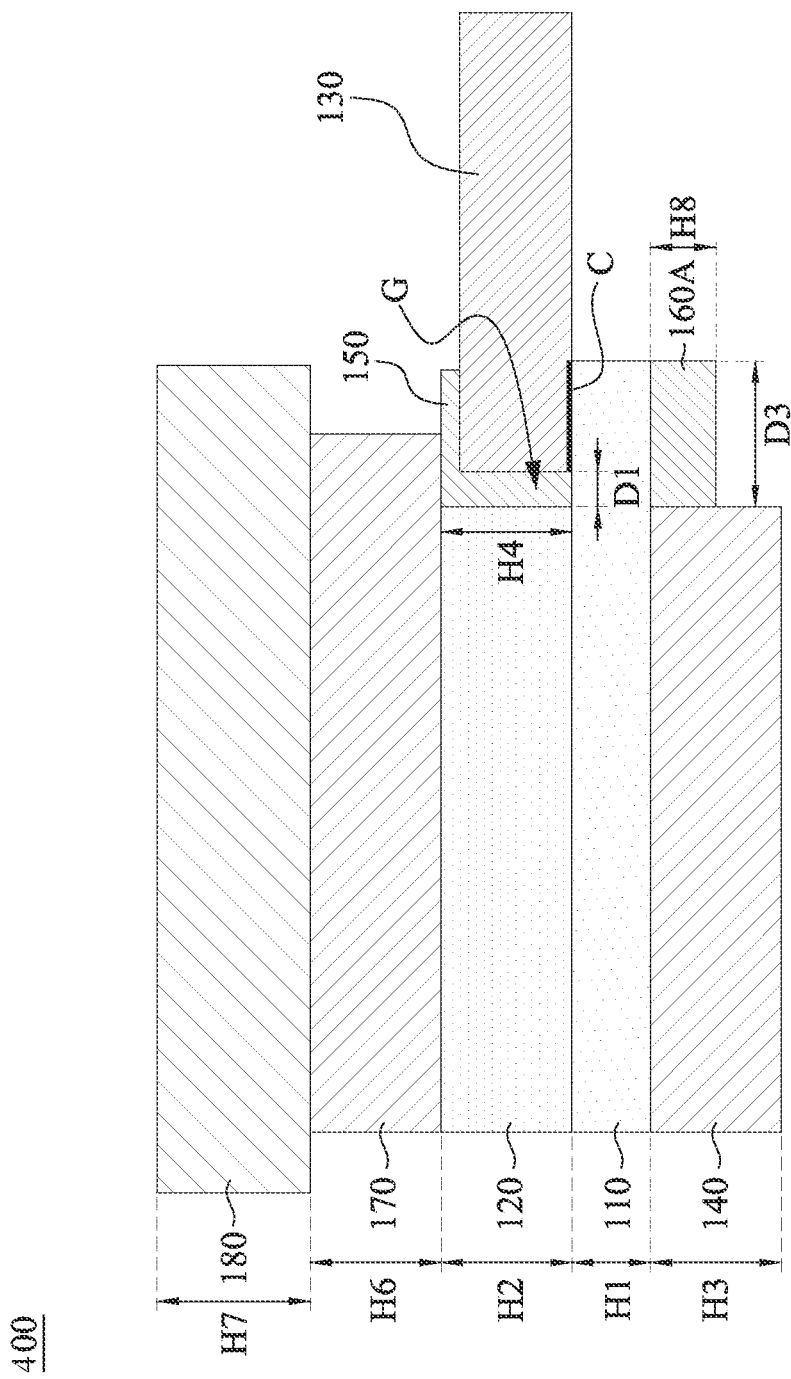
FIG. 1D depicts a part of a structure diagram of an electronic device according to some embodiments of the present disclosure.

FIG. 1D depicts a part of a structure diagram of an electronic device 400 according to some embodiments of the present disclosure. In some embodiments, the first colloid 150 is configured to bond the polarizer 120 and the flexible printed circuit board 130. The first colloid 150 is partially overlapped with the second transparent glue layer 170. The second colloid 160A is configured to bond the substrate 110 and the first transparent glue layer 140. It is noted that the second colloid 160A has a thickness H8 and a width D3. The second colloid 160A is determined how wide a dispensing range is according to the bonding structure (it is noted that the so-called dispensing range depends on the bonding structure design when using the dispensing process to dispense the second colloid 160A). The shape and the size of the second colloid 160A are not limited to the embodiment shown in the figure.

Figure 1E:
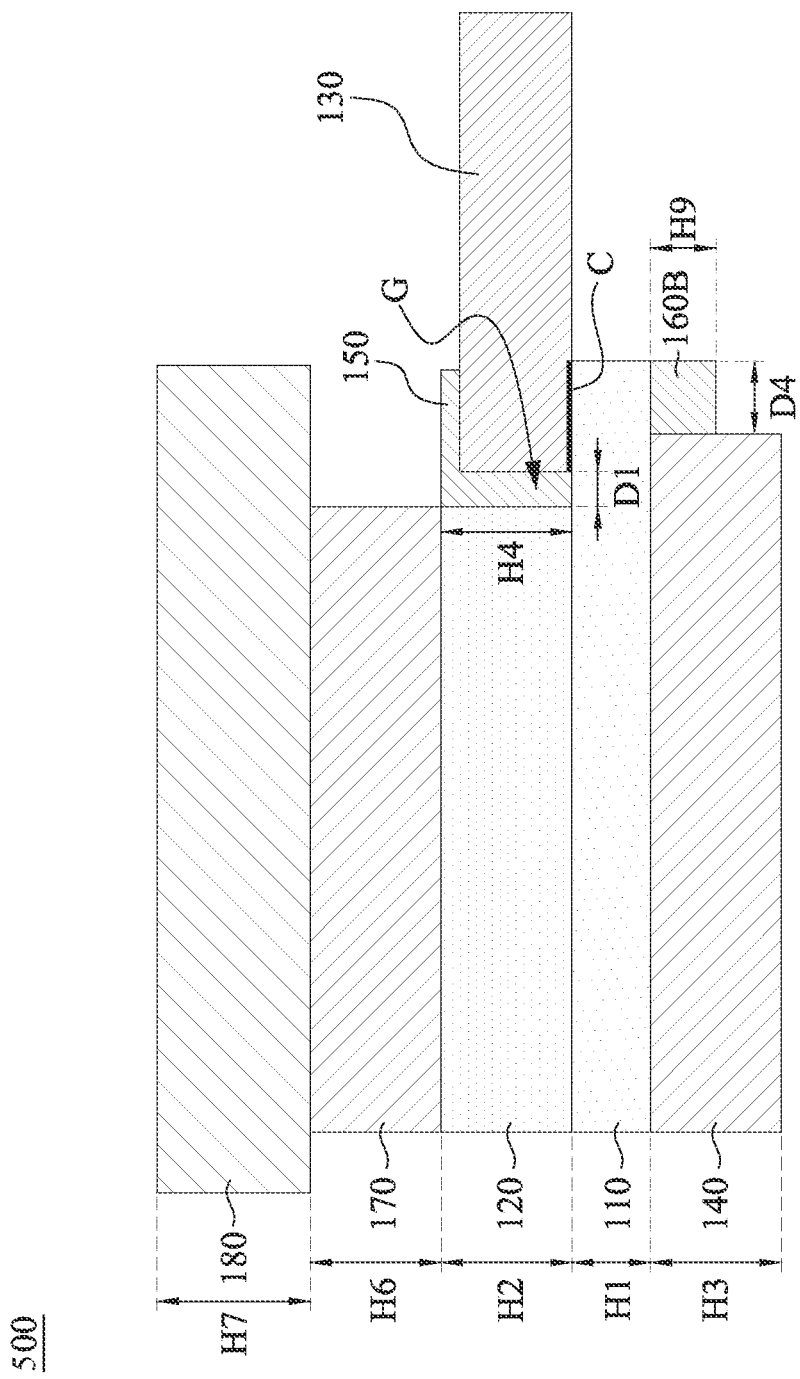
FIG. 1E depicts a part of a structure diagram of an electronic device according to some embodiments of the present disclosure.

FIG. 1E depicts a part of a structure diagram of an electronic device 500 according to some embodiments of the present disclosure. In some embodiments, the first colloid 150 is configured to bond the polarizer 120 and the flexible printed circuit board 130. The first colloid 150 is non-overlapped with (i.e., does not overlap with) the second transparent glue layer 170. The second colloid 160B is configured to bond the substrate 110 and the first transparent glue layer 140. It is noted that second colloid 160B has a thickness H9 and a width D4. The second colloid 160B is determined how wide a dispensing range is according to the bonding structure (it is noted that the so-called dispensing range depends on the bonding structure design when using the dispensing process to dispense the second colloid 160B). The shape and the size of the second colloid 160B are not limited to the embodiment shown in the figure.

Figure 1F:
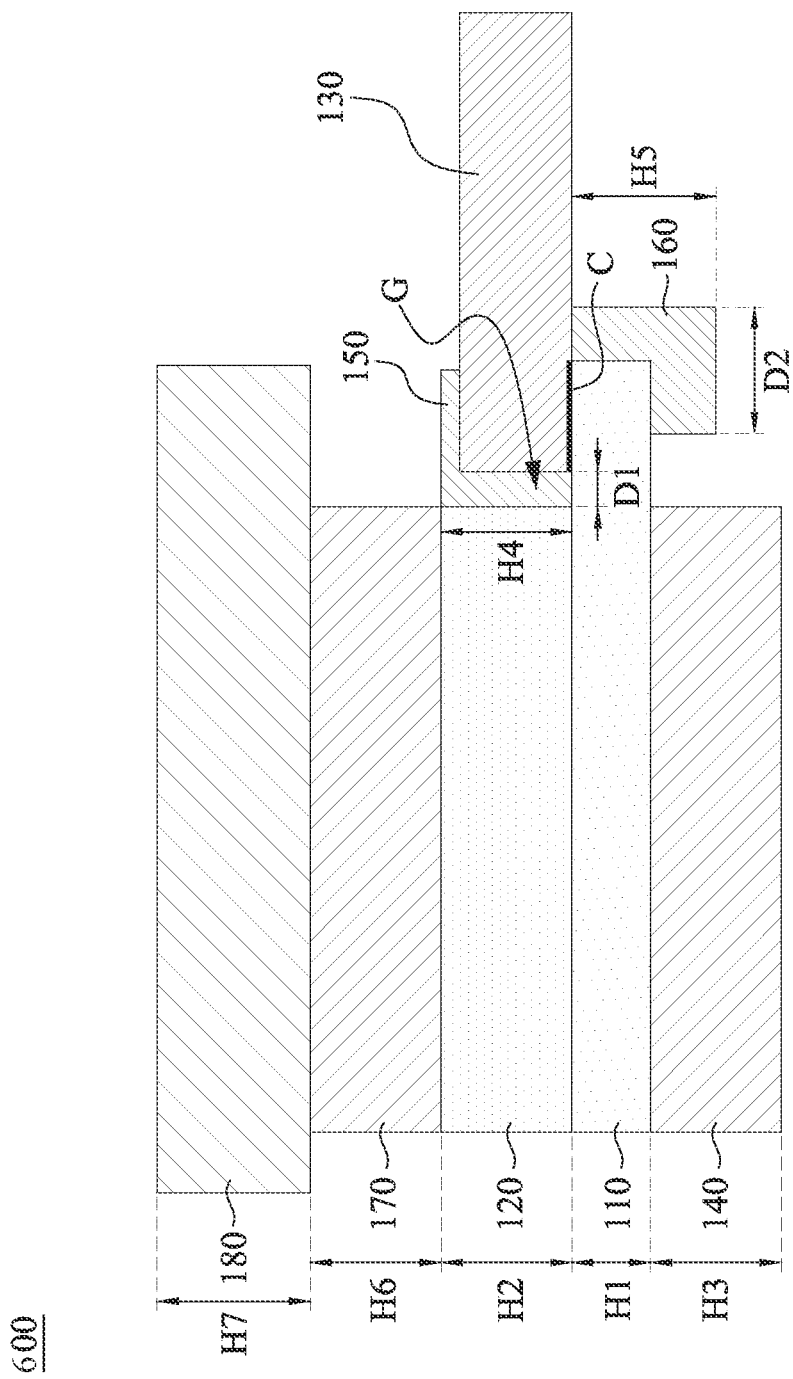
FIG. 1F depicts a part of a structure diagram of an electronic device according to some embodiments of the present disclosure.

FIG. 1F depicts a part of a structure diagram of an electronic device 600 according to some embodiments of the present disclosure. In some embodiments, the first colloid 150 is configured to bond the polarizer 120 and the flexible printed circuit board 130. The first colloid 150 is non-overlapped with (i.e., does not overlap with) the second transparent glue layer 170. The second colloid 160 is configured to bond the substrate 110 and the flexible printed circuit board 130. The first transparent glue layer 140 can be not in contact with the second colloid 160. The structure of the first transparent glue layer 140 and the second transparent glue layer 170 can be designed according to actual needs, and the disclosure is not limited to the embodiments shown in FIG. 1A to FIG. 1F.

Figure 2:
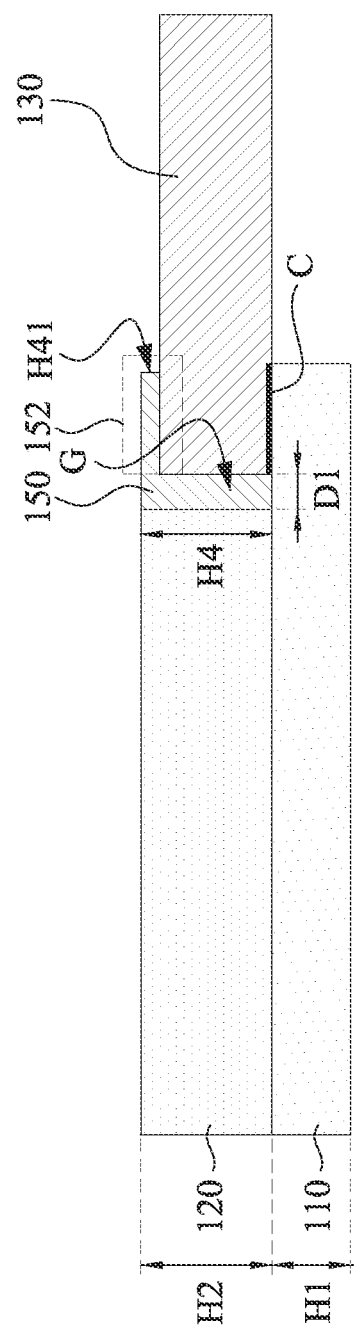
FIG. 2 depicts a side view of a part of a structure diagram of an electronic device according to some embodiments of the present disclosure.
Figure 3:
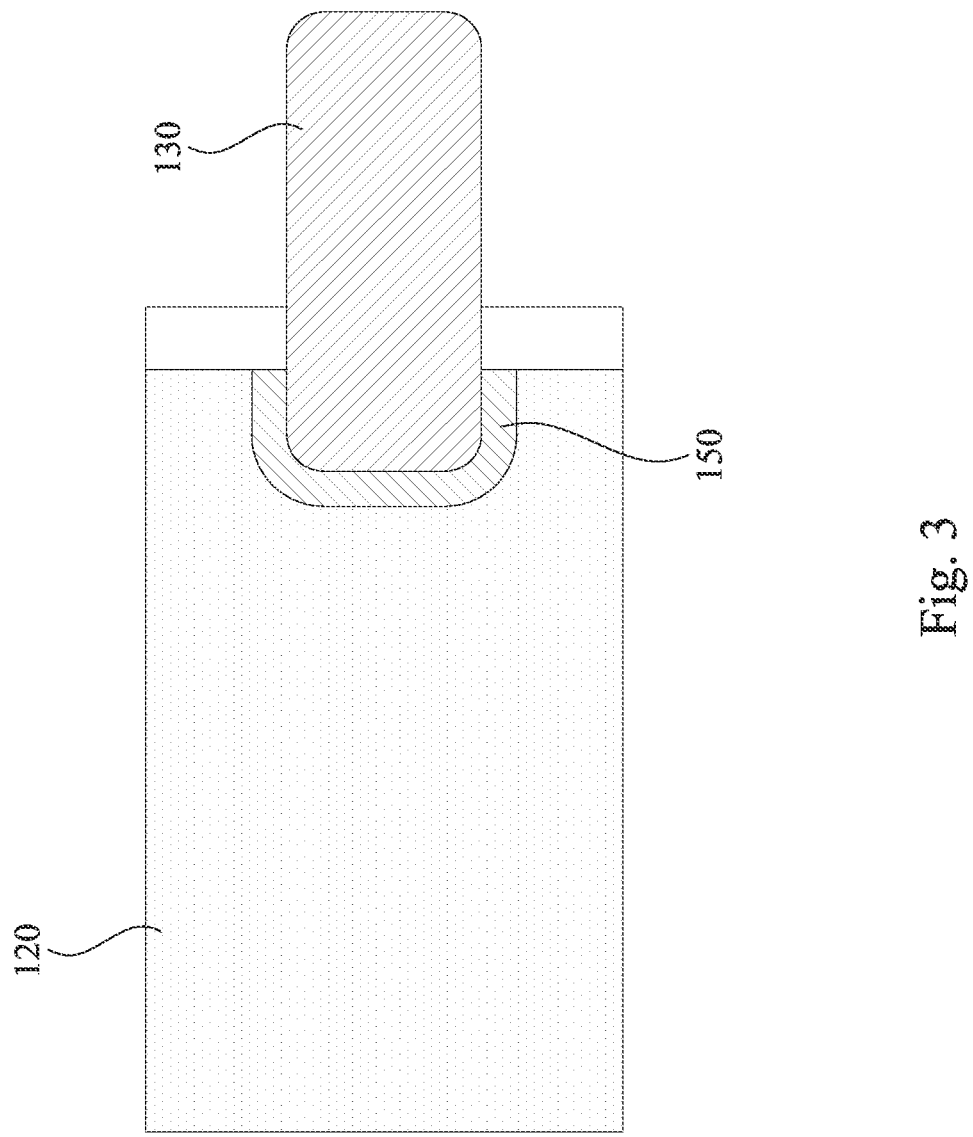
FIG. 3 depicts a top view of a part of a structure diagram of an electronic device according to some embodiments of the present disclosure.

In some embodiments, in order to facilitate the understanding of a structure of the electronic device 100, please refer to FIG. 1A, FIG. 2, and FIG. 3. FIG. 2 depicts a side view of a part of a structure diagram of an electronic device according to some embodiments of the present disclosure. FIG. 3 depicts a top view of a part of a structure diagram of the electronic device shown in FIG. 2 according to some embodiments of the present disclosure. It is noted that the part of the structure shown in FIG. 2 and FIG. 3 only shows the substrate 110, the polarizer 120, the flexible printed circuit board 130, and the first colloid 150.

In some embodiments, referring to FIG. 2, the first colloid 150 is on the substrate 110. The first colloid 150 must be filled in the gap G. In addition, a thickness H4 of the first colloid 150 is between 70 μm and 110 μm. A thickness H41 of a part of layered structure 152 of the first colloid 150 which is above the flexible printed circuit board 130 is between 20 μm and 60 μm.

In some embodiments, the thickness H4 of the first colloid 150 located at the first side of the substrate 110 is two times to five times bigger than the thickness H1 of the substrate 110. In some embodiments, the thickness H41 of the part of the layered structure 152 of the first colloid 150 which is above the flexible printed circuit board 130 is 0.8 times to 2.4 times bigger than the thickness H1 of the substrate 110.

In some embodiments, referring to FIG. 3, the gap G is formed between the flexible printed circuit board 130 and the polarizer 120. As shown in FIG. 3, the bonding structure which is between the flexible printed circuit board 130 and the substrate 110 needs to be filled up with the first colloid 150, which is configured to bond the polarizer 120 to the flexible printed circuit board 130. In some embodiments, a thickness H2 of polarizer 120 is 66 μm.

In some embodiments, the first colloid 150 is not in contact with the second colloid 160. Therefore, from a top view, the second colloid 160 cannot be observed.

In some embodiments, the second transparent glue layer 170 is disposed on the polarizer 120 and is partially overlapped or non-overlapped with the first colloid 150.

Figure 4:
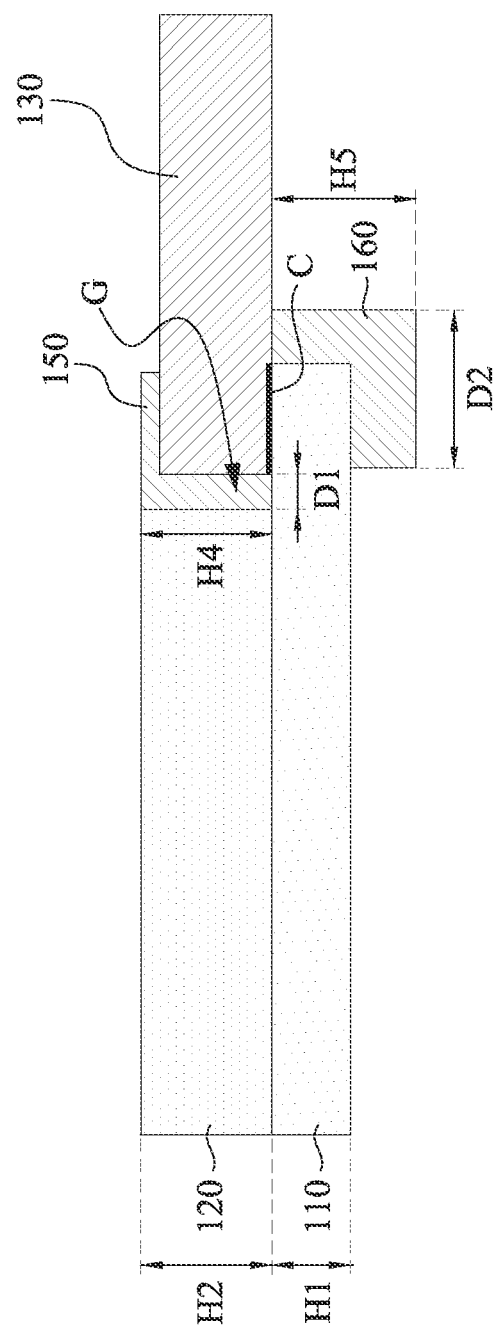
FIG. 4 depicts a side view of a part of a structure diagram of an electronic device according to some embodiments of the present disclosure.

FIG. 4 depicts a side view of a part of a structure diagram of an electronic device according to some embodiments of the present disclosure. It is noted that FIG. 4 is a side view in which the second colloid 160 is added compared to FIG. 2.

In some embodiments, referring to FIG. 4, a thickness H5 of the second colloid 160 is less than 100 μm. The thickness H5 of the second colloid 160 is about four times bigger than the thickness H1 of the substrate 110. A thickness H4 of the first colloid 150 is about 0.7 times to 1.1 times bigger than the thickness H5 of the second colloid 160.

Figure 5:
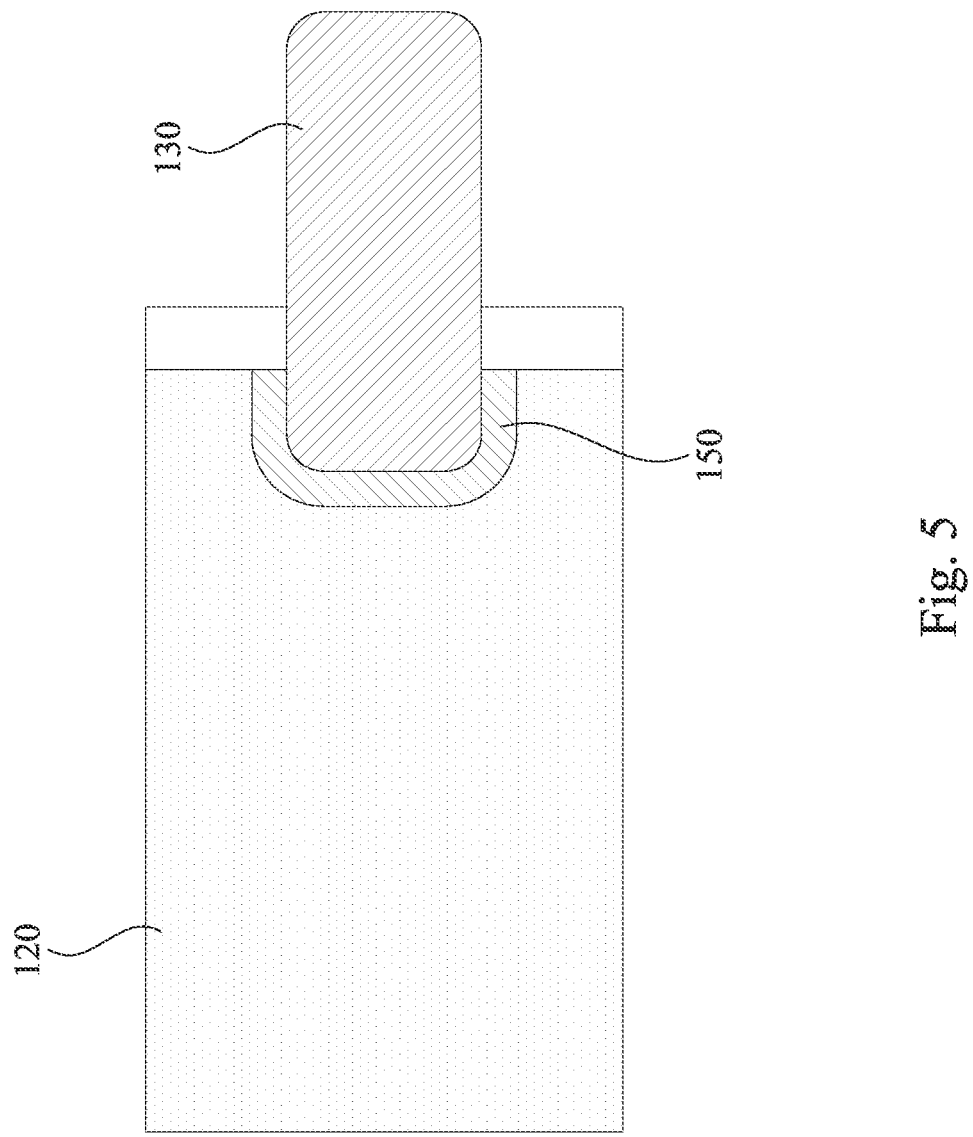
FIG. 5 depicts a top view of a part of a structure diagram of an electronic device according to some embodiments of the present disclosure.

FIG. 5 depicts a top view of a part of a structure diagram of the electronic device shown in FIG. 4 according to some embodiments of the present disclosure. FIG. 6 depicts a bottom view of a part of a structure diagram of the electronic device shown in FIG. 4 according to some embodiments of the present disclosure.

In some embodiments, referring to FIG. 4 and FIG. 6, a width D2 of the second colloid 160 along the substrate 110 to the flexible printed circuit board 130 does not exceed 0.4 mm, and the second colloid 160 which spills over the substrate 110 can be ignored.

Based on the above embodiments, the present disclosure provides an electronic device to improve problems of cracks during bending test of ultra-thin substrates and strengthen bonding structures.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. An electronic device, comprising:
   a substrate, wherein the substrate comprises a first side and a second side, wherein the first side is opposite to the second side;
   a polarizer disposed on the first side of the substrate;

a flexible printed circuit board connected to the first side of the substrate with a conductive glue, wherein a gap is formed between the flexible printed circuit board and the polarizer;

a first transparent glue layer disposed on the second side of the substrate;

a first colloid configured to bond at least two of the substrate, the polarizer, or the flexible printed circuit board, wherein the first colloid fills the gap from a sidewall of the polarizer to a sidewall of the flexible printed circuit board; and a second colloid configured to bond at least two of the substrate, the flexible printed circuit board, or the first transparent glue layer, wherein:

the first colloid is not contact with the second colloid, and the second colloid is in contact with the second side of the substrate.

2. The electronic device of claim 1, wherein a thickness of the first colloid located at the first side of the substrate is two times to five times bigger than a thickness of the substrate.

3. The electronic device of claim 1, wherein a thickness of the substrate is smaller than or equal to 50 μm.

4. The electronic device of claim 1, wherein the first colloid and the second colloid are a same material or different materials.

5. The electronic device of claim 4, wherein each of the first colloid and the second colloid comprises one of acrylic adhesive series or silica gel series.

6. The electronic device of claim 1, further comprising:
a second transparent glue layer disposed on the polarizer and partially overlapped or non-overlapped with the first colloid.

7. The electronic device of claim 1, wherein a thickness of the second colloid is less than 100 μm.

8. The electronic device of claim 1, wherein a width of the second colloid is less than 0.4 mm.

9. The electronic device of claim 6, wherein the first colloid is configured to bond the polarizer and the flexible printed circuit board, wherein the first colloid is partially overlapped with the second transparent glue layer, and wherein the second colloid is configured to bond the substrate, the flexible printed circuit board, and the first transparent glue layer.

10. The electronic device of claim 6, wherein the first colloid is configured to bond the polarizer and the flexible printed circuit board, wherein the first colloid is non-overlapped with the second transparent glue layer, and wherein the second colloid is configured to bond the substrate, the flexible printed circuit board, and the first transparent glue layer.

11. The electronic device of claim 6, wherein the first colloid is configured to bond the polarizer and the flexible printed circuit board, wherein the first colloid is partially overlapped with the second transparent glue layer, and wherein the second colloid is configured to bond the substrate and the flexible printed circuit board.

12. The electronic device of claim 6, wherein the first colloid is configured to bond the polarizer and the flexible printed circuit board, wherein the first colloid is partially overlapped with the second transparent glue layer, and wherein the second colloid is configured to bond the substrate and the first transparent glue layer.

13. The electronic device of claim 6, wherein the first colloid is configured to bond the polarizer and the flexible printed circuit board, wherein the first colloid is non-overlapped with the second transparent glue layer, and wherein the second colloid is configured to bond the substrate and the first transparent glue layer.

14. The electronic device of claim 6, wherein the first colloid is configured to bond the polarizer and the flexible printed circuit board, wherein the first colloid is non-overlapped with the second transparent glue layer, and wherein the second colloid is configured to bond the substrate and the flexible printed circuit board.

15. The electronic device of claim 1, wherein the conductive glue is an anisotropic conductive adhesive.

16. The electronic device of claim 1, wherein a top surface of the first colloid is coplanar with a top surface of the polarizer.

17. The electronic device of claim 1, wherein a bottom surface of the first colloid is coplanar with a bottom surface of the polarizer.

18. The electronic device of claim 1, wherein a height of the polarizer is equal to a height of the first colloid.

19. The electronic device of claim 1, further comprising:
a second transparent glue layer disposed over the polarizer and the flexible printed circuit board, wherein the second transparent glue layer is separated from the flexible printed circuit board by the second transparent glue layer.

20. The electronic device of claim 1, wherein the second colloid is in contact with a sidewall of the first transparent glue layer.

* * * * *